(12) United States Patent
Liu et al.

(10) Patent No.: US 7,694,203 B2
(45) Date of Patent: Apr. 6, 2010

(54) ON-CHIP SAMPLERS FOR ASYNCHRONOUSLY TRIGGERED EVENTS

(75) Inventors: Frankie Y. Liu, Palo Alto, CA (US); Ronald Ho, Mountain View, CA (US); Robert J. Drost, Los Altos, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 301 days.

(21) Appl. No.: 11/773,020

(22) Filed: Jul. 3, 2007

(65) Prior Publication Data
US 2009/0013214 A1 Jan. 8, 2009

(51) Int. Cl.
*G01R 31/28* (2006.01)

(52) U.S. Cl. ...................................... 714/740

(58) Field of Classification Search .................. 714/30, 714/724, 740
See application file for complete search history.

(56) References Cited

U.S. PATENT DOCUMENTS

| | | | |
|---|---|---|---|
| 6,397,354 B1 * | 5/2002 | Ertekin | 714/34 |
| 6,756,775 B2 * | 6/2004 | Jungerman | 324/121 R |
| 7,010,444 B2 * | 3/2006 | Nishikobara et al. | 702/69 |
| 7,360,139 B2 * | 4/2008 | Logisch et al. | 714/744 |
| 7,409,617 B2 * | 8/2008 | Almy et al. | 714/738 |

* cited by examiner

*Primary Examiner*—James C Kerveros
(74) *Attorney, Agent, or Firm*—Park, Vaughan & Fleming LLP (57) ABSTRACT

Embodiments of an integrated circuit that includes a debug circuit are described. This debug circuit is configured to test an asynchronous circuit by performing analog measurements on asynchronous signals associated with the asynchronous circuit, and includes a triggering module configured to gate the debug circuit based on one or more of the asynchronous signals. This triggering module has a continuous mode of operation and a single-shot mode of operation. A timing module within the debug circuit has a timing range exceeding a pre-determined value, and is configured to provide signals corresponding to a first time base or signals corresponding to a second time base. Furthermore, control logic within the debug circuit is configured to select a mode of operation and a given time base for the debug circuit, which is either the first time base or the second time base.

19 Claims, 9 Drawing Sheets

ON-CHIP SAMPLERS FOR ASYNCHRONOUSLY TRIGGERED EVENTS

BACKGROUND

1. Field of the Invention

The present invention relates to techniques for testing and debugging integrated circuits. More specifically, the present invention relates to a method and an apparatus that facilitate on-chip sampling of asynchronously triggered events.

2. Related Art

Advances in semiconductor process technology are making it possible for semiconductor devices to perform increasingly complicated functions at higher processing speeds. Consequently, the process of testing and debugging of integrated circuits is becoming more complicated.

Conventional testing schemes use automated testers to perform a test procedure on a chip and compare the output from the chip to a stored expected response. If an error occurs, designers will determine the root-cause of the error and systematically search for additional problems. Then, corrective action is taken, such as: fixing the design, iterating the chip development cycle, publishing errata, and/or adding additional features.

To find the root cause of an error, designers traditionally rely on a combination of existing techniques, such as: inference measurements, measurements using Built-In Self-Test (BIST) circuits, and/or external-probe measurements. Unfortunately, all of these techniques have limitations.

Figure 1:
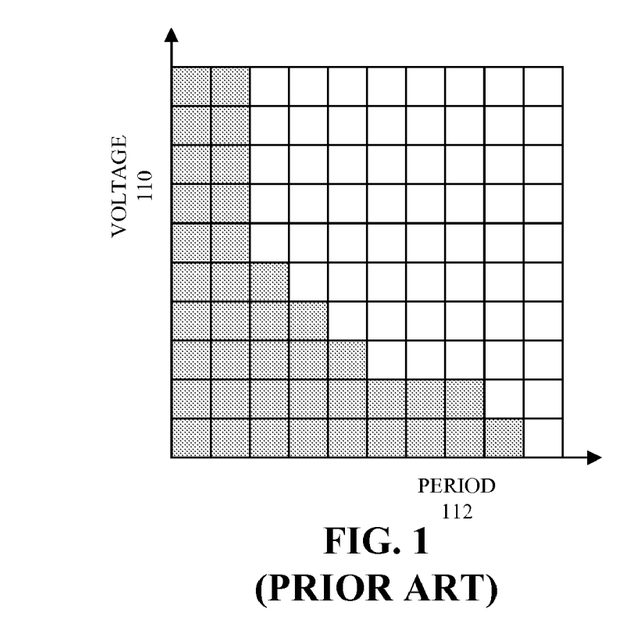
FIG. 1 is drawing illustrating a 'shmoo' plot for an existing interference measurement technique.

Inference measurements plot chip functionality versus power supply and frequency. For example, 'shmoo' plots reveal circuit behavior through power and frequency trends. FIG. 1 provides a drawing illustrating a shmoo plot (with voltage 110 plotted as a function of period 112) for an existing interference-measurement technique. This plot shows behavior that indicates an RC-dominated speedpath. In particular, as the period 112 decreases, the chip fails the test (as indicated by the gray-shaded squares) no matter how high the voltage 110 is raised. Unfortunately, interference measurements only probe the symptoms of a problem, i.e., they cannot directly measure specific circuits. Thus, while simple and fast, these measurements are of limited use in determining the root-cause of a problem.

Figure 2:
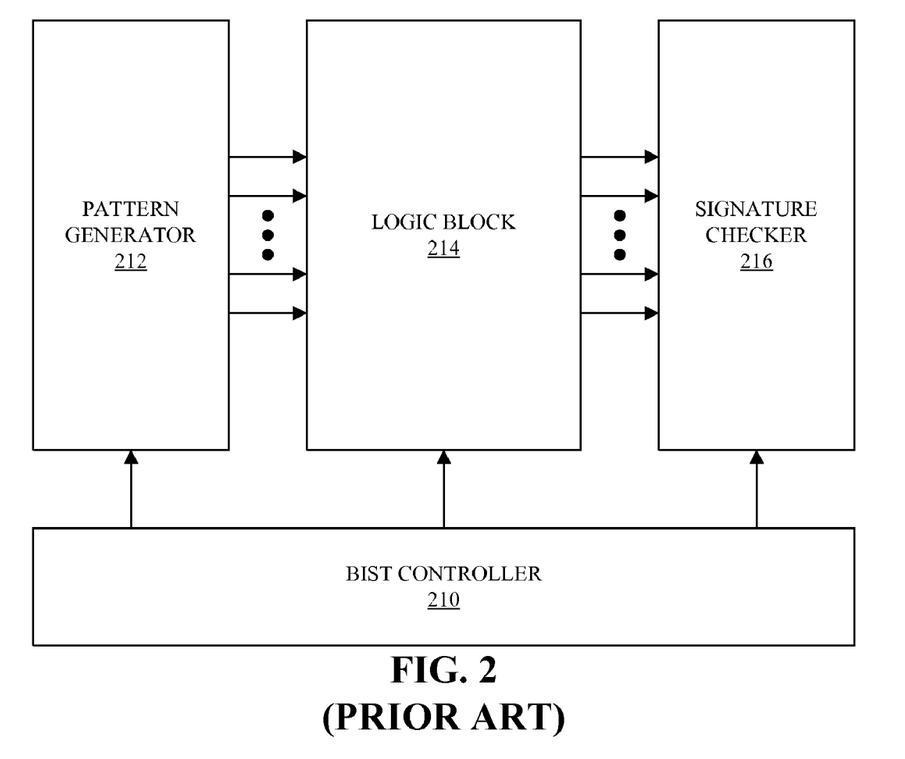
FIG. 2 is a block diagram illustrating an existing BIST circuit.

BIST circuits generate inputs (often random) to specific logic blocks and check the resulting output signatures. FIG. 2 provides an illustration of a conventional BIST circuit. Based on instructions from BIST controller 210, pattern generator 212 provides inputs to logic block 214, and the resulting outputs are analyzed by signature checker 216. However, while BIST circuits have advantages (they are cheap, relatively non-invasive, and monitor the potential cause of failure), these circuits require chip area and use scan chains to handle inputs and outputs. Consequently, BIST circuits can generally only test digital logic states.

Figure 3:
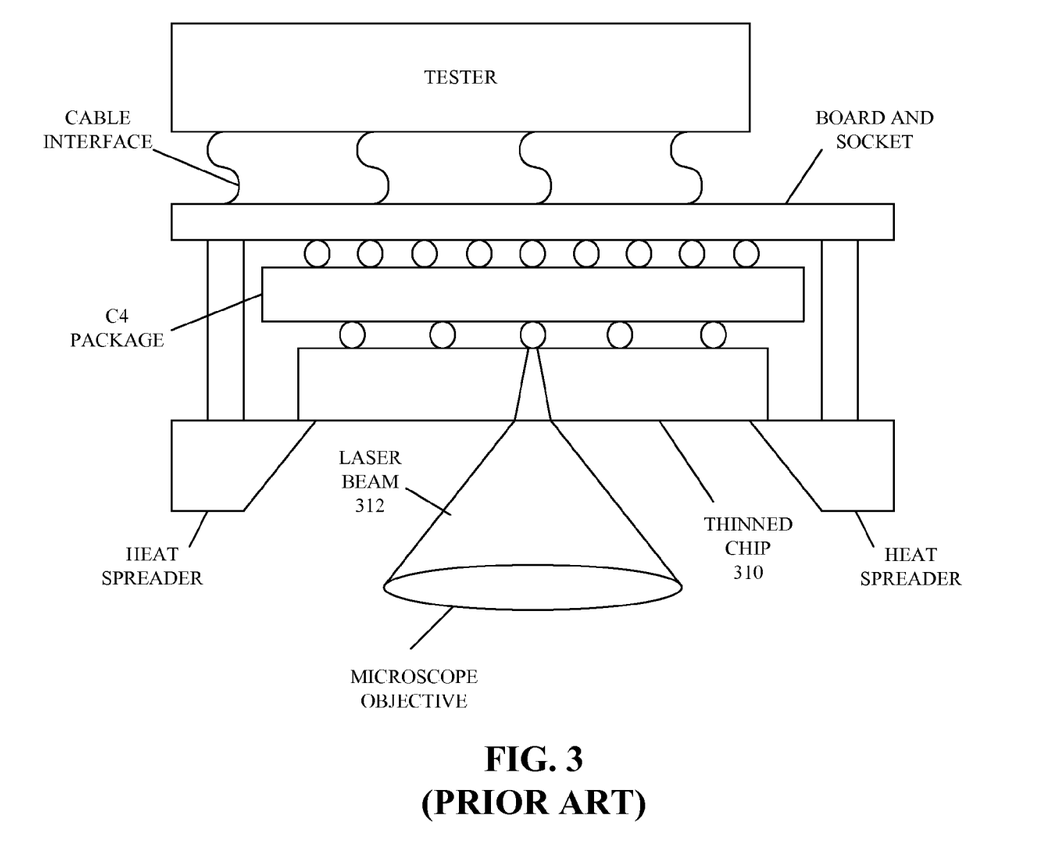
FIG. 3 is a block diagram illustrating an existing external-probe measurement technique.

External probes (such as electron beams, mechanical probes, or laser probes) offer direct analog measurements of individual nodes. For example, FIG. 3 provides an illustration of an existing external-probe measurement technique in which the reflectivity of portions of a thinned chip 310 as a function of voltage is probed using a laser beam 312. Unfortunately, external probes require either invasive measurement techniques and/or test setups that are incompatible with packaged chips. Consequently, while external probes can be used to directly measure signals of interest, their expense and the required modifications to the circuits being probed can severely limit their use.

To supplement these techniques, designers have also used on-chip high-bandwidth analog samplers (so-called 'analog BIST' or analog probe circuits) that can probe specific nodes in a chip. These circuits are placed at nodes that are known to require post-fabrication probing or are opportunistically placed in critical circuits in case their fabricated performance misses specifications. During operation, analog probe circuits use well-known sub-sampling techniques to transfer high-bandwidth information off the chip for analysis. However, these circuits require a synchronous clock, and are, consequently, not suitable for measuring asynchronous signals.

Hence, what is needed is a method and an apparatus that facilitates on-chip testing and debugging of integrated circuits that support asynchronously triggered events (such as those associated with asynchronous signals) without the problems listed above.

SUMMARY

One embodiment of the present invention provides a debug circuit that is configured to test an asynchronous circuit by performing analog measurements on asynchronous signals associated with the asynchronous circuit. This debug circuit includes a triggering module configured to gate the debug circuit based on one or more of the asynchronous signals. This triggering module has a continuous mode of operation and a single-shot mode of operation. A timing module within the debug circuit has a timing range exceeding a pre-determined value, and is configured to provide signals corresponding to a first time base or signals corresponding to a second time base. Furthermore, control logic within the debug circuit is configured to select a mode of operation and a given time base for the debug circuit, which is either the first time base or the second time base.

In some embodiments, signals corresponding to the first time base are associated with an integrated current. Moreover, in some embodiments signals corresponding to the second time base are associated with a gate delay and/or a delay line. Note that in some embodiments the first time base and the second time base partially overlap each other.

In some embodiments, the first time base is larger than the second time base. And in some embodiments the first time base and the second time base are each adjustable.

In some embodiments, the signals corresponding to the first time base and/or the second time base delay one or more triggering signals provided by the triggering module.

In some embodiments, the testing of asynchronous circuits involves using Built-In Self Test (BIST) circuits.

In some embodiments, the debug circuit further includes a multiplexer, which is configured to select either the signals corresponding to the first time base or the signals corresponding to the second time base.

In some embodiments, the timing range is between 0.2 and 4 ns.

In some embodiments, the asynchronous circuit is contained with an integrated circuit that also includes the debug circuit.

In some embodiments, the asynchronous circuit includes a solid-state memory component.

In some embodiments, during the continuous mode of operation the triggering module is configured to provide triggering signals. For example, the triggering signals may facilitate approximately identical sampling of successive asynchronous signals. Alternatively, the triggering signals may facilitate sub-sampling of successive asynchronous signals.

In some embodiments, the control logic is configured to select the single-shot mode of operation when the asynchronous signals are multi-modal.

In some embodiments, the control logic includes a state machine.

In some embodiments, the asynchronous signals are compatible with an asynchronous symmetric persistent pulse protocol (asP*).

In some embodiments, a measurement circuit within the debug circuit is configured to sample the asynchronous signals based on one or more triggering signals provided by the triggering module.

Another embodiment of the present invention provides a method for testing an asynchronous circuit using an on-chip debug circuit. During this method, asynchronous signals associated with the asynchronous circuit are received. Then, a time-delay signal is generated. Note that the time-delay signal corresponds to a first time base or a second time base, and a timing range associated with the time-delay signal exceeds a pre-determined value. Next, one or more trigger signals are provided based on the asynchronous signals and the time-delay signal, where multiple trigger signals are generated during a continuous mode of operation of the debug circuit and one trigger signal is generated during a single-shot mode of operation of the debug circuit. Then, analog measurements are performed on one or more of the asynchronous signals, where multiple measurements are performed during the continuous mode of operation and a single measurement is performed during the single-shot mode of operation.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of an integrated circuit and a method that facilitate on-chip sampling of asynchronously triggered events (such as those associated with asynchronous signals) are described. In this integrated circuit, on-chip high-bandwidth asynchronous sampling circuits (also referred to as debug circuits) are used to non-invasively probe analog voltages for on-chip and/or off-chip measurements, such as testing and debugging of one or more asynchronous circuits. Note that this asynchronous circuit may be located on the same chip as the integrated circuit or on another chip. Moreover, in some embodiments the integrated circuit includes Built-In Self Test (BIST) circuits.

In some embodiments, the integrated circuit includes an analog sampling head and a timing module, which has a variable delay element with a large timing range (for example, between 0.2 and 4 ns). This integrated circuit may be activated by a triggering module based, at least in part, on one or more asynchronously triggered events. For example, the integrated circuit may operate in a one-shot or a multi-shot mode of operation. Moreover, the integrated circuit may emulate sub-sampling using repeated triggering events and different delays. In general, the integrated circuit is self-timed using one or more time bases (which may overlap each other). Consequently, in some embodiments the integrated circuit does not require an external clock for synchronization.

Embodiments of the integrated circuit may be used in a variety of applications, including: a memory interface, a CPU interface, a solid-state memory component (such as a Static Random Access Memory (SRAM), Dynamic Random Access Memory (DRAM), etc.), a multiplier, an adder, a Field Programmable Gate Array (FPGA), and/or circuits that use asynchronous signals which are compatible with an asynchronous symmetric persistent pulse protocol (asP*). Furthermore, the integrated circuit may be used to diagnose problems along interfaces between: differently clocked regions, between clocked and un-clocked regions, and/or between un-clocked regions.

This integrated circuit does not occupy much silicon area. Moreover, testing and debugging performed by the integrated circuit is non-invasive, and the integrated circuit allows synchronous and asynchronous events to be probed and provides a high fidelity reconstruction of signals of interest. For example, the integrated circuit may have a small sensitivity to: process variations, power supply fluctuations, and/or thermal loads.

Figure 4:
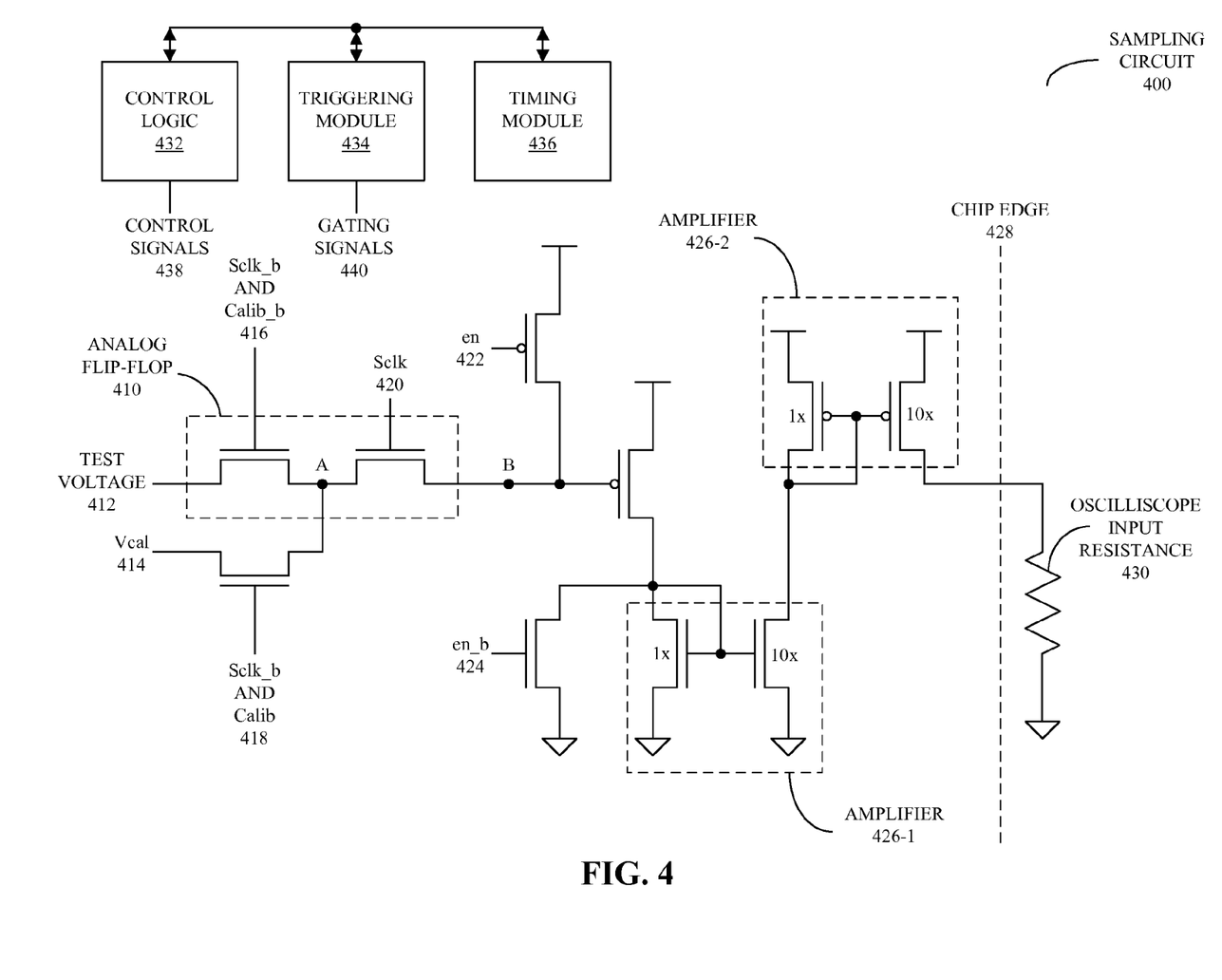
FIG. 4 is a block diagram illustrating a sampling circuit in accordance with an embodiment of the present invention.

We now described embodiments of the integrated circuit. FIG. 4 provides a block diagram illustrating an embodiment of a sampling circuit 400 (which is sometimes referred to as a sampler). In this circuit, an on-chip sampling head, which presents a very small load to the tested circuit, provides the functionality of an analog flip-flop 410. In particular, when the voltage on Sclk 420 increases a facsimile of test voltage 412 transfers to the gate of a PMOS transistor. Note that this implementation allows sampling of voltages near ground. Furthermore, sampling full-swing voltages can be performed by boosting the gate voltages of the NMOS pass gates and the source voltage of the PMOS transistor to $V_{dd}+V_t$.

Then, the PMOS transistor converts the sampled voltage into a current, which is amplified using current mirrors in amplifiers 426 and driven over chip edge 428 (i.e., off-chip) into oscilloscope input resistance 430. While not shown, in some embodiments a source-follower is added after the inputs to the sampling circuit 400. This prevents the circuit from disturbing the node under test, especially if this node is only weakly driven. Moreover, in some embodiments multiple samplers are multiplexed together between the current mirrors in amplifiers 426. In this case, a given sampler may be selected using a JTAG/scan chain interface, thereby reducing the number of pins used.

To determine how input voltages translate into output currents, a separate calibration path (selected, in part, using a calibration signal Calib) allows the sampling circuit 400 to sample an externally applied DC voltage, Vcal 414. In particular, by applying the logical AND of the logical inverse signals Sclk_b and Calib_b 416, and the logical AND of signals Sclk_b and Calib 418, to the appropriate NMOS transistors, Vcal 414 may be coupled to the PMOS transistor. Then, by sweeping this calibration voltage the relationship between input voltage and output current may be determined for the sampling circuit 400. This calibration curve may be stored in a look-up table (not shown). Note that if the input uses a source-follower as a buffer, another source-follower on the calibration input allows first-order cancellation of the resulting voltage shift.

Furthermore, note that the sampling circuit 400 may be operated in different modes of operation. In a so-called 'visual' mode of operation, the sampling-circuit clock and chip clock periods differ by a very small amount, and the chip is set to repeat the same operation every clock cycle. For example, the chip clock period may be set to 1 nanosecond (ns) and the sampling-circuit clock period may be set to 1.001 ns. During each cycle, the sampling circuit 400 examines a new point on a test waveform, and over many cycles the sampling circuit 400 'walks' across the test waveform (as described further below with reference to FIG. 5A). In an exemplary embodiment, sweeping test voltage 412 produces 1000 different sampling cycles, with each sampling operation separated by 1 picosecond (ps). In this mode of operation, the bandwidth of the sampled voltage may be limited by the incomplete charge-sharing through the analog flip-flop 410, i.e., incomplete charge-sharing between nodes A and B in the sampling circuit 400. However, the benefit of the visual mode of operation is that the output is a replica of the internal test waveform at the node under test, albeit on an expanded time scale. Thus, if a time base of the output oscilloscope is set to the beat frequency of the two clocks (1 MHz in this example), a picture of the real on-chip test waveform may be obtained, which can then be captured and calibrated.

In the second, 'accurate' mode of operation, the sampling-circuit clock and the chip clock have the same frequency, although not the same phase. Over many cycles, the circuit continuously samples the same voltage in test voltage 412, ensuring that the resulting voltage on the gate of the PMOS transistor accurately reflects this sampled voltage (as described further below with reference to FIG. 5B). Then, the resulting output current may be recorded and mapped back to an input voltage using the calibration curves. Next, by stepping the phase of the sampling-circuit clock relative to the chip clock, the sampling circuit 400 can map out another voltage. By repeating these operations, the sampling circuit 400 can eventually (and accurately) determine the test waveform.

Figure 5A:
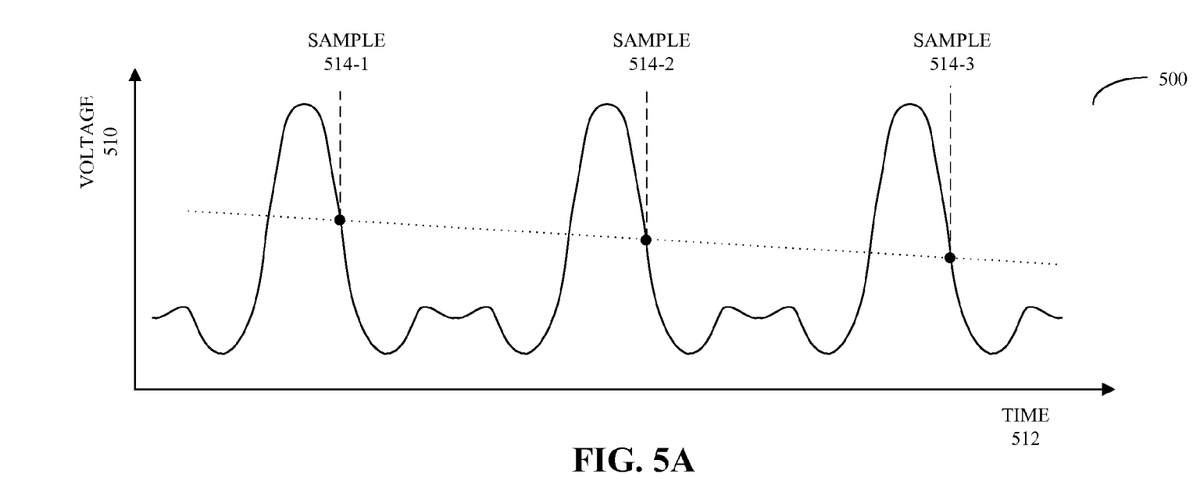
FIG. 5A is a drawing illustrating sampling during a mode of operation of the sampling circuit in accordance with an embodiment of the present invention.
Figure 5B:
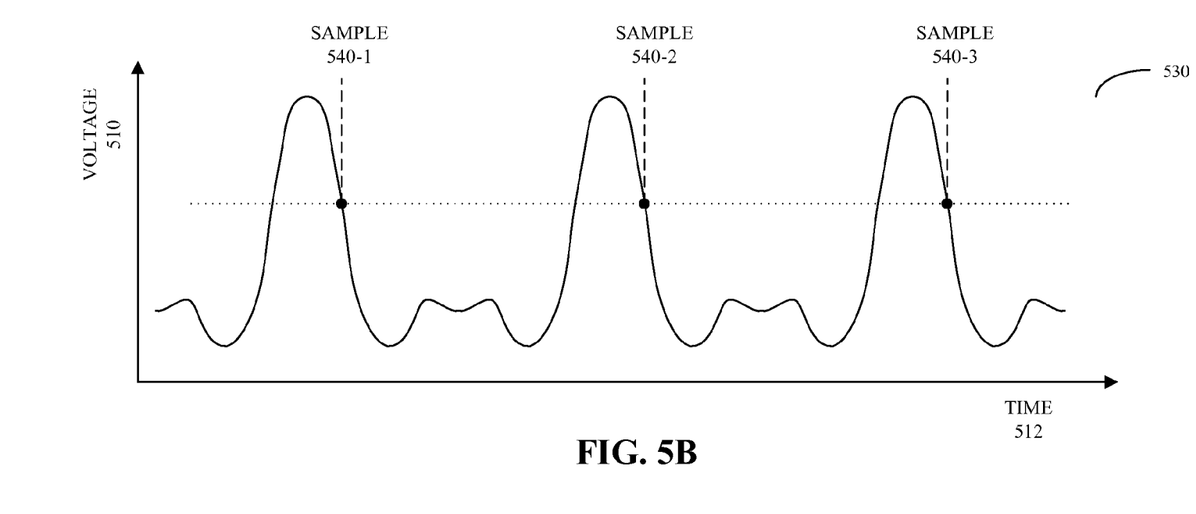
FIG. 5B is a drawing illustrating sampling during a mode of operation of the sampling circuit in accordance with an embodiment of the present invention.

FIGS. 5A and 5B provide drawings (with voltage 510 as a function of time 512) illustrating embodiments 500 and 530 of sampling during these modes of operations of the sampling circuit 400 (FIG. 4). Note that the sub-sampling illustrated in embodiment 500 corresponds to the visual mode of operation, where samples 514 slowly walk through the test waveform (over multiple cycles) and the full set of samples 514 provides a replica of the test waveform. Similarly, embodiment 530 corresponds to the accurate mode of operation, where during a given time interval samples 540 are obtained at a given voltage.

Note that in these embodiments there is an externally fixed phase relationship between the chip clock and the sampling clock. Thus, the description thus far presumes that there is a separate external clock that is synchronized with the internal clock on the chip, and that the waveform is stable (time invariant) during multiple measurements (such as the samples 514 and/or 540). However, this is not the case with asynchronous signals (i.e., signals that do not have a definite period and/or do not follow any particular clock) provided by asynchronous circuits. In the discussion that follows, a solution to the problem of accurately measuring such signals is to trigger the sampling in the sampling circuit 400 (FIG. 4) using a trigger signal that is temporally proximate to or coincident with the transient waveform.

In particular, generalizing the on-chip sampling circuit for use with asynchronous circuits involves replacing chip and sampling-circuit clock signals with appropriate strobes. For an asynchronous sampling circuit, an internal triggering event replaces the chip clock, and a variable delay chain sets the phase relationship between the chip and sampling-circuit strobes. As long as the node under test is 'activated' by the selected internal triggering event, then sampling it a fixed delay after that event gives the proper measurement. Note that the triggering event need not cause the activity that is being sampled. Instead, it only needs to consistently precede the activity. This technique resembles a synchronous sampling circuit in which the sampling clock occurs a user-defined delay after the chip clock, except that now, the chip clock may have irregular and unpredictable arrival times. Note that in some embodiments an asynchronous sampling circuit is also used in a synchronous system and triggered by a standard clock signal.

Referring back to FIG. 4, triggering module 434 provides one or more of such strobe or gating signals 440 (such as Sclk 420 and Sclk_b) based on timing signals (i.e., a sampling clock) provided by timing module 436 and an asynchronous signal (such as the test waveform and/or another waveform), which is used as a triggering event for the triggering module 434. As discussed further below with reference to FIG. 8, this timing module 436 may have a wide timing range, and may include a slow time base and a fast time base that are used to delay the gating signals 440. This delay may be variable or adjustable.

Moreover, control logic 432 provides control signals 438 (such as Calib and Calib_b). Note that the control logic 432 may also select a given time base in the timing module 436, as well as a continuous mode of operation or a single-shot mode of operation. For example, during the continuous mode of operation the triggering module 434 may provide multiple gating signals 440, which may facilitate approximately identical sampling of successive asynchronous signals. Alternatively, the gating signals 440 may facilitate sub-sampling of successive asynchronous signals. Note that in some embodiments control logic 432 selects the single-shot mode of operation, which is useful when the asynchronous signals are multi-modal, i.e., when the asynchronous signals can follow different paths (for example, a '1' or a '0') during each sampling event.

While the sampling circuit 400 is illustrated as having a number of components in a given configuration, in other embodiments this circuit (as well as the embodiments described below) may include fewer components or additional components, two or more components may be combined into a single component, and/or a position of one or more components may be changed. For example, in some embodiments, the sampling circuit 400 is disabled by applying an enable (en) 422 signal and its logical inverse (en_b) 424 to a PMOS transistor and an NMOS transistor, respectively.

Furthermore, functions of the sampling circuit 400 may be implemented in hardware and/or in software. In some embodiments, transistors are implemented using: PMOS, NMOS, and/or CMOS. And in some embodiments, a measurement circuit (such as the oscilloscope) is implemented on the integrated circuit with the sampling circuit 400. This measurement circuit may be triggered using one or more gating signals 440 provided by triggering module 434 (i.e., the one or more triggering signals for sampling of the asynchronous signal).

We now describe embodiments of control logic 432 and the triggering module 434. Many data paths in circuits use a bundled-data control scheme in which control blocks (such as control logic 432) pass tokens to each other. In the discussion that follows, asP* is used as an illustrative example. However, this approach also applies to any bundled-data control scheme.

Figure 6:
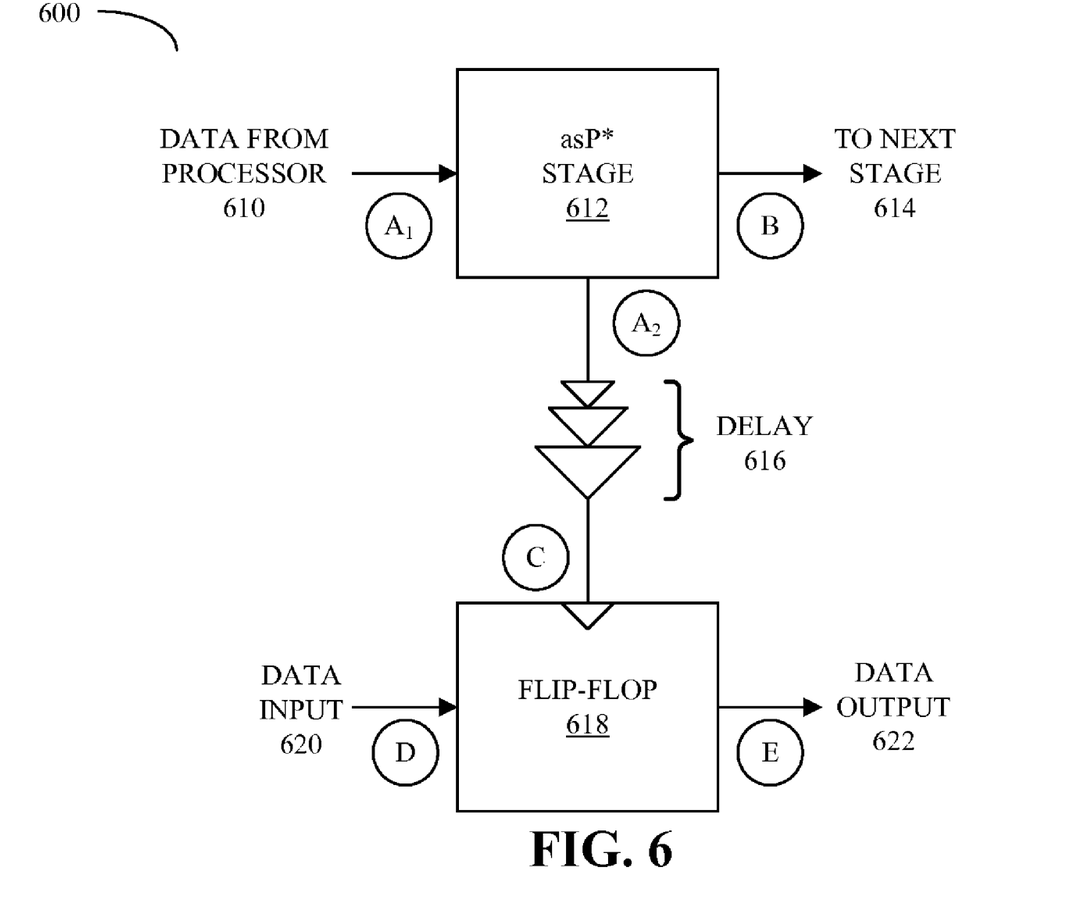
FIG. 6 is a block diagram illustrating a circuit for sampling and controlling asynchronous symmetric persistent pulse protocol (asP*) data in accordance with an embodiment of the present invention.

FIG. 6 provides a block diagram illustrating an embodiment 600 of a circuit for sampling and controlling asP* data. In this circuit, a latching strobe fires as a data token from a processor 610 enters an asP* stage 612. After a delay 616, which is required to ramp up a strobe which is used to drive a full set of latches, the data associated with this token is captured. In addition, if the successive asP* stage is empty, then the token (and its data) can move on to that next stage 614. Therefore, any data path latching activity and successive control activity of an asP* stage follows not only the token arrival signal but also its latching strobe signal. These relationships can be exploited by using either the token arrival or the latching strobe signal (at nodes $A_1$ and $A_2$ in circuit 600) as the triggering event. Then, after a user-defined delay, sampling may occur at nodes of interest (such as nodes B-E).

Note that even if the latching strobe signal at node $A_2$ is used as the triggering event, it is still possible to probe moving voltages on node D, which includes data input 620 to flip-flop 618. Because of the ramp-up delay 616 between the latching strobe and the time the data actually gets captured, asP* controls are often 'kited,' or launched ahead of the data. Thus when the latching strobe first fires, the data has not yet reached the associated flip-flop 618 at node D, although the data will arrive within the ramp-up time of the strobe. As a result, the latching strobe at node $A_2$ precedes: successive control node B, the ramped-up strobe signal at node C, and flopped data output 622 at node E. In addition, this latching strobe also precedes the final settling of data input 620 at node D at the input to the flip-flip 618. Thus, sampling both control and data using the latching strobe $A_2$ as a trigger provides a useful window to both data and control around the final data latching signal at node C. Note that in some embodiments the signal at node $A_1$ is used as the triggering event.

In some embodiments, an asynchronous sampling circuit attaches a delay line directly to the triggering signal (such as an asynchronous signal) for the triggering module 434 (FIG. 4). Then, sampling may be performed after the rising edge of each triggering signal propagates through the delay line. Note that if the delay line includes an RC-propagation wire then it may have several problems. In particular, it may be difficult to allow different delays without very careful (and process dependent) placement of unevenly spaced taps off the wire, and longer delays may require increased tap spacings (the delay is proportional to square of the length). Note that these longer delays may vary due to degraded slopes of the triggering signals. In addition, very long delays may require a very long serpentined wire that occupies a significant area.

However, if the delay line includes cascaded gates, different delays having a resolution smaller than that of an inverter that has a fanout of four (i.e., a resolution of about 80 ps in a 180 nm technology) may require a combination of very low fanout gates and gate interpolation. Unfortunately, both of these features may cost too much area and power to be practical. More importantly, neither RC lines nor cascaded gates gracefully deal with multiple triggering events that arrive before the sampling circuit has finished sampling or resetting itself after a previous triggering event.

Consequently, in some embodiments a timer-based delay element with a simple state machine control is used to provide a delay element with: fine resolution, small area, and the ability to screen out selected triggering events. In these embodiments, the triggering event starts a voltage steadily ramping up to a finish voltage. Note that the voltage start point may be defined as an initial condition, thereby enabling variable delays without requiring multiple taps from a delay line. In addition, a controller (such as control logic 432 in FIG. 4) may ignore any additional triggering events while the voltage is still ramping up, and it may also ignore any triggering events that happen while the timer is resetting itself to the initial conditions.

Figure 7A:
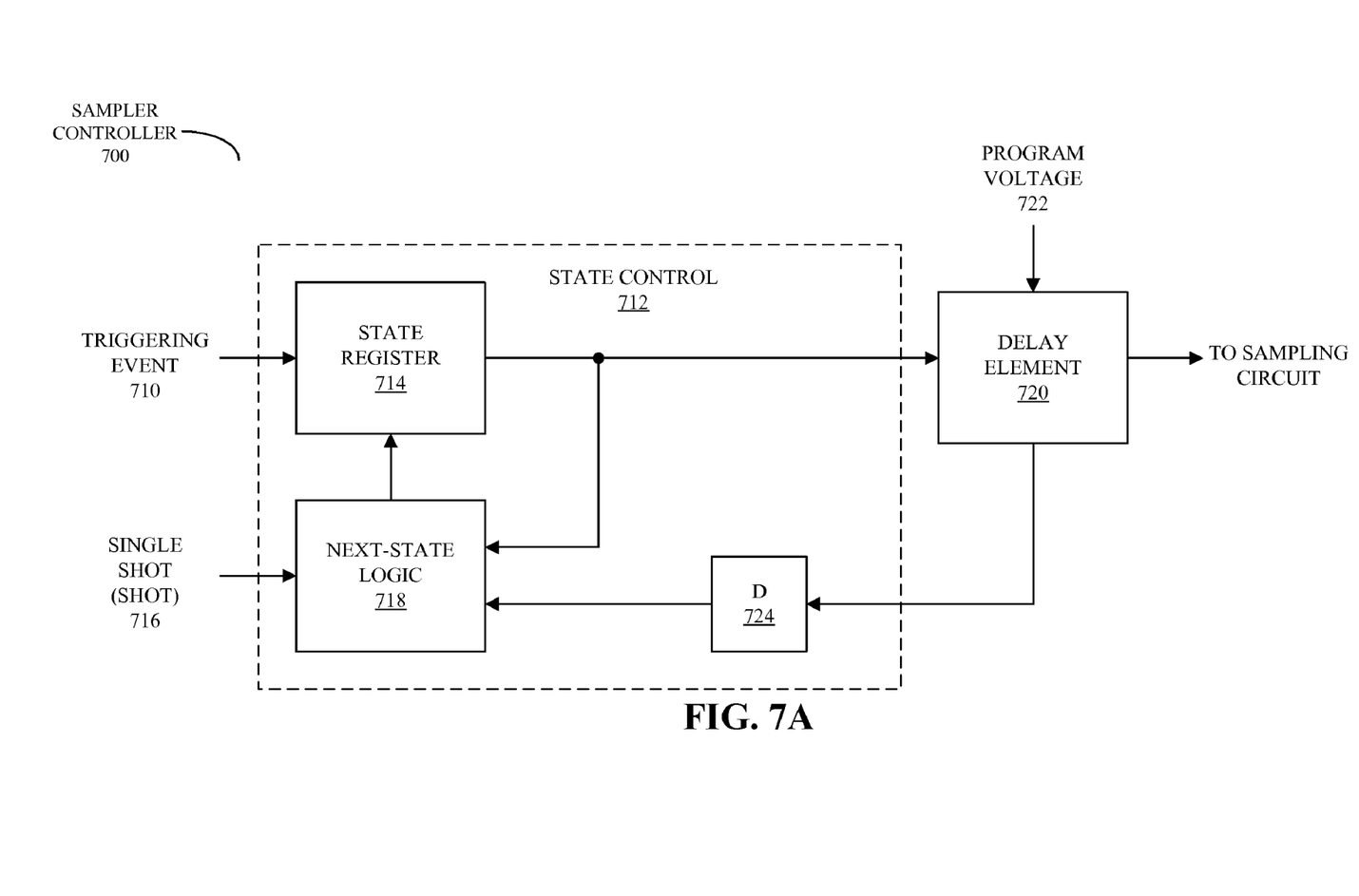
FIG. 7A is a block diagram illustrating a sampler controller in accordance with an embodiment of the present invention.
Figure 7B:
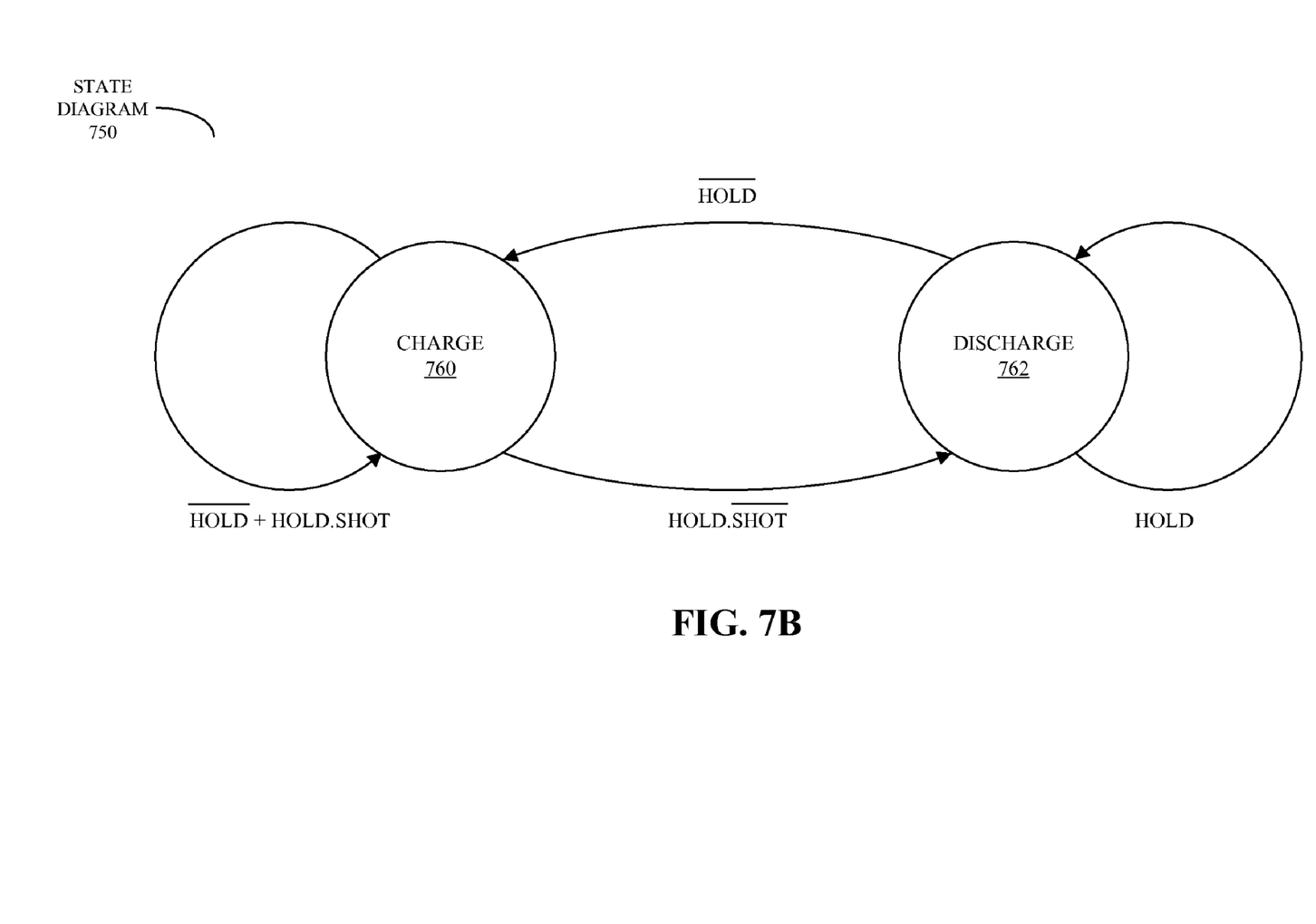
FIG. 7B is a block diagram illustrating a state diagram in accordance with an embodiment of the present invention.

FIG. 7A provides a block diagram illustrating an embodiment of a sampler controller 700 (for a sampling circuit, such as the sampling circuit 400 in FIG. 4), and FIG. 7B provides a block diagram illustrating an embodiment of a corresponding state diagram 750. This sampling controller includes two sections, a delay element 720 and a state control 712. Note that the state control 712 includes a state register 714 and next-state logic 718 (such as NAND gates 826-2 and 826-3 in FIG. 8).

State register 714 includes a charge state 760 (during which the timer has been activated by triggering event 710 and is ramping up) and a discharge state 762 (during which the timer is reset to user-defined initial conditions to prepare for the next triggering event). While in the charge state 760, the sampler controller 700 ignores additional triggering events, and once the ramping finishes, a sampling circuit is instructed to take a sample. Cycling back and forth between the charge state 760 and the discharge state 762 allows repeated samples of the node under test, all with a fixed delay from the triggering event 710.

Changing the timer settings (for example, using program voltage 722) allows a new series of sampled 'snap shots.' With sufficiently fine-grained control over the timer settings, very accurate waveforms may be recovered. Note that for simplicity state changes occur on triggering events (such as triggering event 710). Therefore, every other triggering event may be used to move from the charge state 760 back to the discharge state 762.

Note that triggering events may arrive at any time, potentially just when the next-state-logic signal arrives. Thus, the state register 714 may include two cascaded flip-flops (such as flip-flops 830 in FIG. 8) to synchronize the next-state logic 718 with the triggering event 710 and to reduce the probability of metastability. While this does not entirely eliminate metastability issues, making them rare may be sufficient for a test and debug circuit. Note that these two flip-flops may lead to an additional triggering cycle between states. Therefore, in some embodiments four rising edges of the triggering event 710 are required for each sampling action. Also note that sampler controller 700 includes a small fixed delay element (D) 724 (such as inverter 836 in FIG. 8) that spaces out transitions between the charge state 760 and the discharge state 762. This provides extra timing margin if triggering events are very closely spaced.

In some embodiments, sampler controller 700 allows for two sampling modes of operation. In a continuous mode of operation, with single shot (SHOT) 716 held low, the sampling circuit is strobed at every fourth triggering event, allowing capture of data that is 'trigger-stationary,' i.e., that faithfully repeats after each (or at least after every fourth) triggering event.

However, it may be desirable to sample a waveform that can follow multiple trajectories, such as the 'eye' in an eye pattern of a data waveform, which can trace either a logical '1' or a logical '0' trajectory. This may also happen if it is difficult to put the asynchronous circuit being tested into a completely repeatable loop, and the node being sampled ends up with variable data. In this case, if this waveform is sampled with a continuous sampling circuit, the output will unfortunately be a weighted average of the trajectories. Thus, if the output sends half '1's and half '0's (i.e., a bimodal distribution), the sampling circuit will output a steady stream of average-value currents.

Therefore, in some embodiments sampler controller 700 also supports a single-shot mode. In this mode, with SHOT 716 asserted high, sampler controller 700 holds the sampled signal after capture and ignores all further triggering events until the user pulses SHOT 716. This gives time for the output to be measured without additional samples smearing the output, as long as the measurement is performed within any leakage time constants, a requirement that many standard test equipment interfaces can fulfill. Thus, sampler controller 700 allows non-stationary data to be captured. In the context of the previous example of a data eye, many samples of single-shot data will display bi-modal results, corresponding to the two trajectories in the eye pattern.

Figure 8:
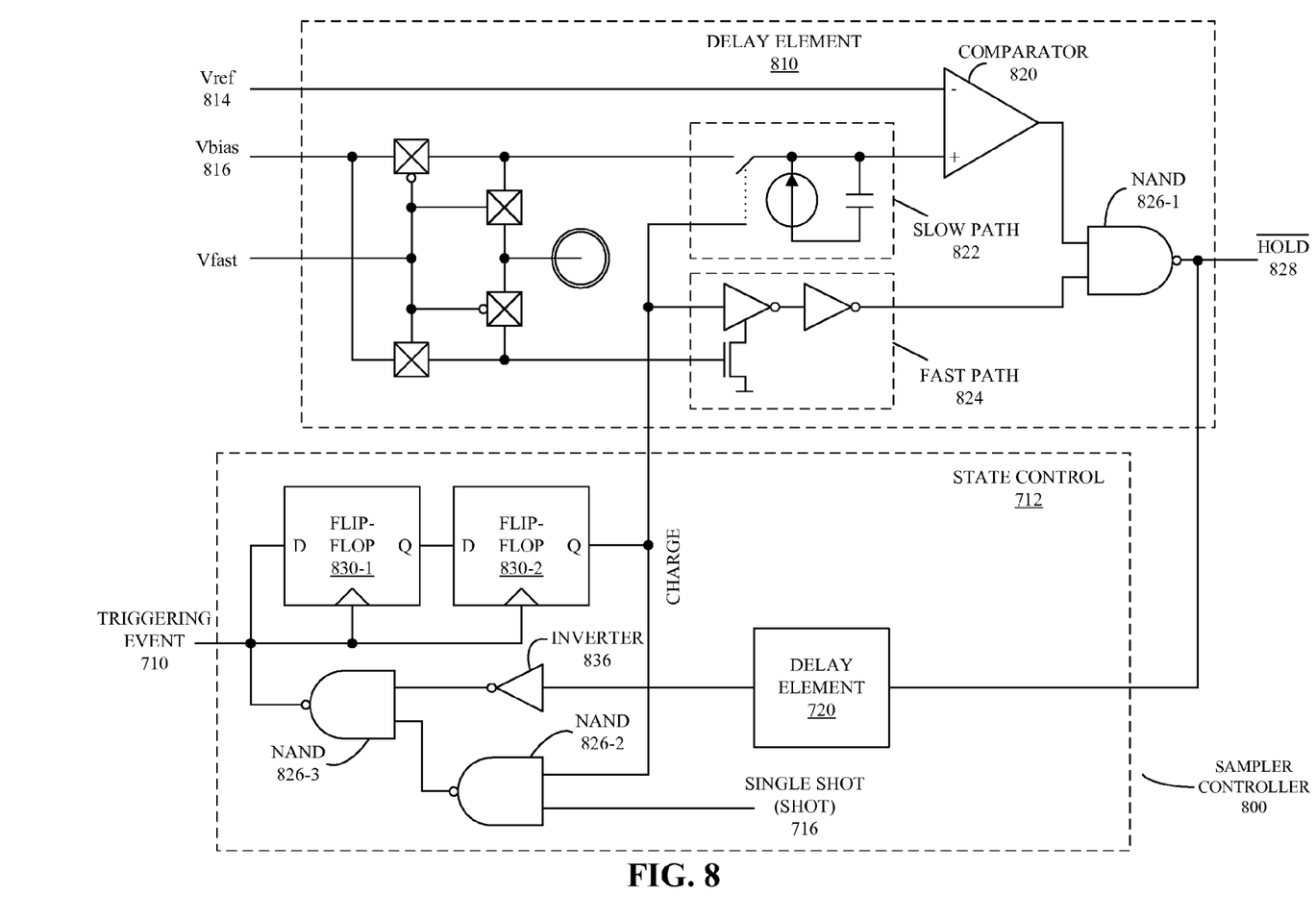
FIG. 8 is a block diagram illustrating a sampler controller in accordance with an embodiment of the present invention.

FIG. 8 provides a block diagram illustrating an embodiment of a sampler controller 800. In this circuit, a delay element 810 includes a slow path 822 and a fast path 824, and a multiplexer (such as a switch) to select one or the other. In an exemplary embodiment, these components provide a dynamic delay range between 0.2 and 4 ns. If the slow path 822 is chosen, a state transition to the charge state 760 (FIG. 7B) enables a current source to charge up a capacitor whose initial voltage was set to an external voltage during the prior discharge state 762 (FIG. 7B). Note that the rising capacitor voltage eventually crosses a threshold voltage, flipping a comparator 820 and, via NAND gate 826-1, firing the sampling clock or strobe in the sampling circuit using a signal called HOLD bar 828. This path may be slowed down or sped up by: changing the charging current, the initial voltage, and/or the reference voltage (Vref) 814.

Note that a latency of the slow path 822 may range from 10 FO4 delays (i.e., 800 ps in a 180 nm technology) to over 4 ns. To reduce the lower end of the latency range, the fast path 824 may be selected and may simply forward the charge transition to the output. As shown in the sampler controller 800, this fast path may be adjusted by resistively loading the pulldown of an inverter, thereby providing overlap with the latency range of the slow path 822.

To detect when the capacitor voltage crosses its threshold, the comparator 820 uses a three-stage amplifier (not shown). In this amplifier, the first two stages may each contain a current-mirror loaded differential amplifier followed by a decision circuit with positive feedback. Moreover, the third stage may be a self-biased differential amplifier followed by an inverter to bring the output rail-to-rail.

In some embodiments, the available dynamic range of the slow path 822 is extended by reducing the charging current or by increasing the capacitance. However, because the comparator 820 is a charge-sensitive device, its time resolution depends on its input-signal slope. In turn, this slope is directly proportional to the ratio of charging current to capacitance, thus establishing a trade-off between time resolution and available dynamic range. Note that the slow path 822 is differential to lessen common-mode noise and power supply sensitivities.

Delay variations due to process variations or slow thermal cycles in the sampler controller 800 may be characterized and corrected through calibration. Note that the sensitivity to power-supply variations is a source of jitter on the sampling strobe. In general, the delay decreases at higher power-supply voltages. However, in simulations (not shown) a cross-over due to different power-supply voltages occurs at an external bias voltage (Vbias) 816 around 0.9 V. This cross-over happens because the initial voltage on the capacitor is pulled down to Vbias 816 through a transmission gate. As the power supply increases, this initial pulldown to Vbias 816 is more effective, making the initial voltage condition lower at higher supply voltages. Therefore, at high supply voltages a capacitor initialized to a lower initial voltage will charge faster, and at lower supply voltages a capacitor initialized to a higher initial voltage will charge slower.

Note that the slow path 822 and the fast path 824 merge via the NAND gate 826-1. In some embodiments, the slow path 822 is extended beyond its maximum delay by triggering off an earlier stage, or from a duplicate block of an earlier stage to minimize loading effects.

Figure 9:
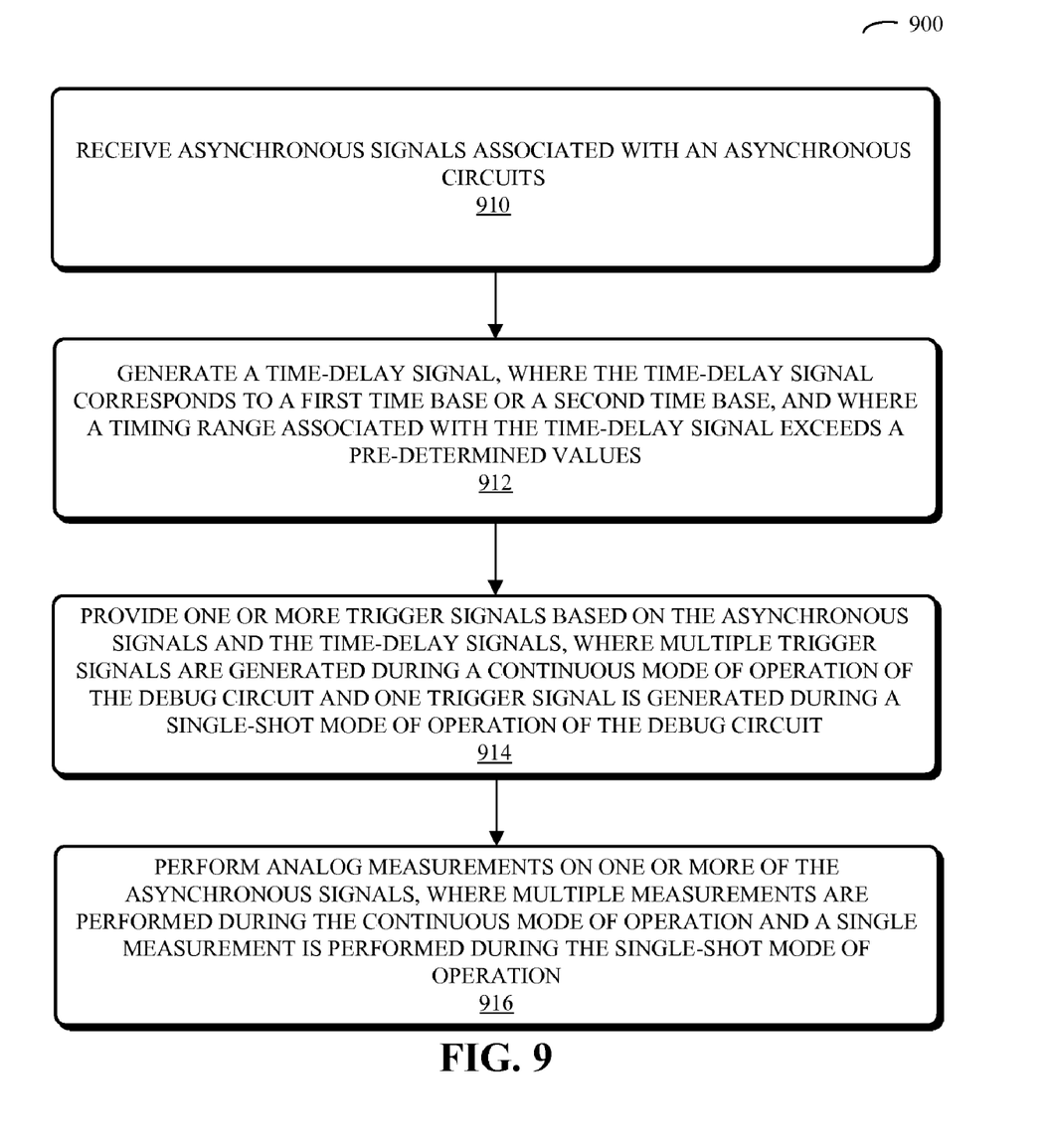
FIG. 9 is a flow chart illustrating a process for testing an asynchronous circuit using an on-chip debug circuit in accordance with an embodiment of the present invention.

We now describe embodiments of methods for testing and/or debugging an asynchronous circuit using an on-chip debug circuit. FIG. 9 provides a flow chart illustrating a process 900 for testing an asynchronous circuit using an on-chip debug circuit. During this process, asynchronous signals associated with the asynchronous circuit are received (910). Then, a time-delay signal is generated (912). Note that the time-delay signal corresponds to a first time base or a second time base, and a timing range associated with the time-delay signal exceeds a pre-determined value (such as 4 ns).

Next, one or more trigger signals are provided based on the asynchronous signals and the time-delay signal, where multiple trigger signals are generated during a continuous mode of operation of the debug circuit and one trigger signal is generated during a single-shot mode of operation of the debug circuit (914). Then, analog measurements are performed on one or more of the asynchronous signals, where multiple measurements are performed during the continuous mode of operation and a single measurement is performed during the single-shot mode of operation (916).

In some embodiment of the process 900 there may be additional or fewer operations, the order of the operations may be changed, and two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated circuit comprising a debug circuit configured to test an asynchronous circuit by performing analog measurements on asynchronous signals associated with the asynchronous circuit, wherein the debug circuit includes:
   a triggering module configured to generate one or more triggering signals that gate one or more of the asynchronous signals associated with the asynchronous circuit, wherein the triggering module has a continuous mode of operation and a single-shot mode of operation;
   a timing module, wherein the timing module has a timing range exceeding a pre-determined value, and wherein the timing module is configured to at least provide signals corresponding to a first time base or signals corresponding to a second time base;
   a measurement circuit configured to sample an analog value for the one or more asynchronous signals based on the one or more triggering signals, wherein during the continuous mode of operation, the measurement circuit is configured to sample a weighted-average current value from multiple signal value measurements, and wherein during the single-shot mode of operation, the measurement circuit is configured to sample a single signal value; and
   control logic configured to select a mode of operation and a given time base for the debug circuit, wherein the given time base is either the first time base or the second time base.

2. The integrated circuit of claim 1, wherein signals corresponding to the first time base are associated with an integrated current.

3. The integrated circuit of claim 1, wherein signals corresponding to the second time base are associated with a gate delay or a delay line.

4. The integrated circuit of claim 1, wherein the first time base is larger than the second time base.

5. The integrated circuit of claim 1, wherein the first time base and the second time base are each adjustable.

6. The integrated circuit of claim 1, wherein the signals corresponding to the first time base delay one or more triggering signals provided by the triggering module.

7. The integrated circuit of claim 1, wherein the signals corresponding to the second time base delay one or more triggering signals provided by the triggering module.

8. The integrated circuit of claim 1, wherein the integrated circuit includes Built-In Self Test (BIST) circuits that test the asynchronous circuits.

9. The integrated circuit of claim 1, wherein the debug circuit further includes a multiplexer, which is configured to select either the signals corresponding to the first time base or the signals corresponding to the second time base.

10. The integrated circuit of claim 1, wherein the timing range is between 0.2 and 4 ns.

11. The integrated circuit of claim 1, further comprising the asynchronous circuit.

12. The integrated circuit of claim 11, where the asynchronous circuit includes a solid-state memory component.

13. The integrated circuit of claim 1, wherein the first time base and the second time base partially overlap each other.

14. The integrated circuit of claim 1, wherein the triggering signals provided by the triggering module during the continuous mode of operation facilitate approximately identical sampling of successive asynchronous signals.

15. The integrated circuit of claim 1, wherein during the continuous mode of operation the triggering module is configured to provide triggering signals to facilitate sub-sampling of successive asynchronous signals.

16. The integrated circuit of claim 1, wherein the control logic is configured to select the single-shot mode of operation when the asynchronous signals are multi-modal.

17. The integrated circuit of claim 1, wherein the control logic includes a state machine.

18. The integrated circuit of claim 1, wherein the asynchronous signals are compatible with an asynchronous symmetric persistent pulse protocol (asP*).

19. A method for testing an asynchronous circuit using an on-chip debug circuit, comprising:
   receiving asynchronous signals associated with the asynchronous circuit;
   generating a time-delay signal, wherein the time-delay signal corresponds to a first time base or a second time base, and wherein a timing range associated with the time-delay signal exceeds a pre-determined value;
   providing one or more trigger signals based on the asynchronous signals and the time-delay signal, by:
      generating multiple trigger signals during a continuous mode of operation of the debug circuit, and generating one trigger signal during a single-shot mode of operation of the debug circuit; and
   performing analog measurements on one or more of the asynchronous signals, by:
      performing multiple measurements to sample a weighted-average current value during the continuous mode of operation, and performing a single measurement during the single-shot mode of operation.

* * * * *